United States Patent [19]

Ueda et al.

[11] Patent Number: 5,157,478

[45] Date of Patent: Oct. 20, 1992

[54] TAPE AUTOMATED BONDING PACKAGED SEMICONDUCTOR DEVICE INCORPORATING A HEAT SINK

[75] Inventors: Tetsuya Ueda; Haruo Shimamoto; Yasuhiro Teraoka; Hideya Yagoura; Hiroshi Seki, all of Itami, Japan

[73] Assignee: Mitsubishi Denki Kabushiki Kaisha, Tokyo, Japan

[21] Appl. No.: 810,354

[22] Filed: Dec. 18, 1991

Related U.S. Application Data

[63] Continuation of Ser. No. 401,145, Aug. 31, 1989, abandoned.

[30] Foreign Application Priority Data

Apr. 19, 1989 [JP] Japan .................... 1-97640

[51] Int. Cl.⁵ .................... H01L 23/28; H01L 23/25
[52] U.S. Cl. .................... 357/72; 357/73; 357/81; 357/80
[58] Field of Search .................... 357/72, 73, 81, 80

[56] References Cited

U.S. PATENT DOCUMENTS

| 2,874,313 | 2/1959 | Githens | 357/81 |
| 3,290,564 | 12/1966 | Wolff, Jr. | 357/81 |
| 3,659,164 | 4/1972 | Gaylor | 357/81 |
| 3,689,804 | 9/1972 | Ishihama | 357/81 |
| 4,396,935 | 8/1983 | Schuck | 357/74 |
| 4,563,383 | 1/1986 | Kuneman | 428/216 |
| 4,620,215 | 10/1986 | Lee | 357/81 |
| 4,692,716 | 2/1987 | Wakabayashi et al. | 360/104 |
| 4,859,614 | 8/1989 | Sugahara et al. | 437/8 |
| 4,876,588 | 10/1989 | Miyamoto | 357/81 |
| 5,053,855 | 10/1991 | Michii et al. | 357/81 |

OTHER PUBLICATIONS

'AlN Heat Sink Banding to the Chip', IBM Tech. Discl. Bul., Jan. 90.

*Primary Examiner*—Andrew J. James
*Assistant Examiner*—Stephen D. Meier
*Attorney, Agent, or Firm*—Leydig, Voit & Mayer

[57] ABSTRACT

A packaged semiconductor device includes an insulating film having an opening, a semiconductor chip disposed in the opening of the insulating film and having a plurality of electrodes, a plurality of leads, each having one end connected to a corresponding electrode, the plurality of leads being supported on the insulating film, a heat radiator disposed opposite and spaced from the semiconductor chip, and a resin package body encapsulating the semiconductor chip and part of the heat radiator, leaving a surface of the heat radiator externally exposed and the second ends of the plurality of leads extending outwardly from the package.

23 Claims, 14 Drawing Sheets

FIG. IA
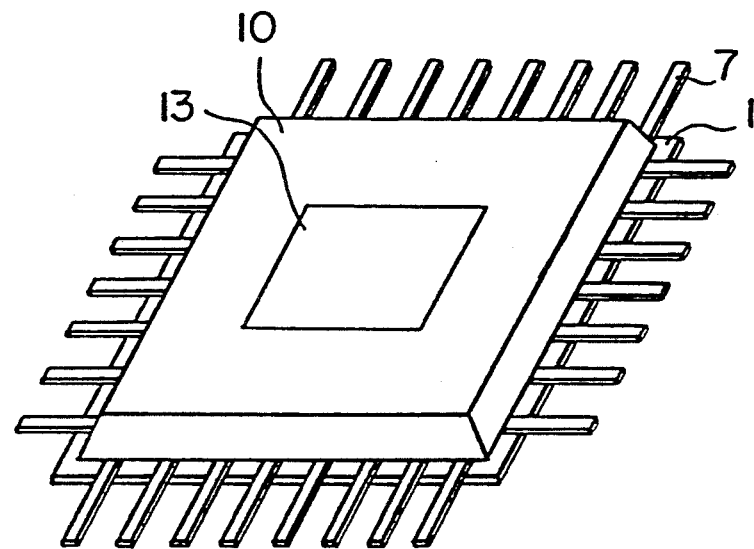
FIG. IB
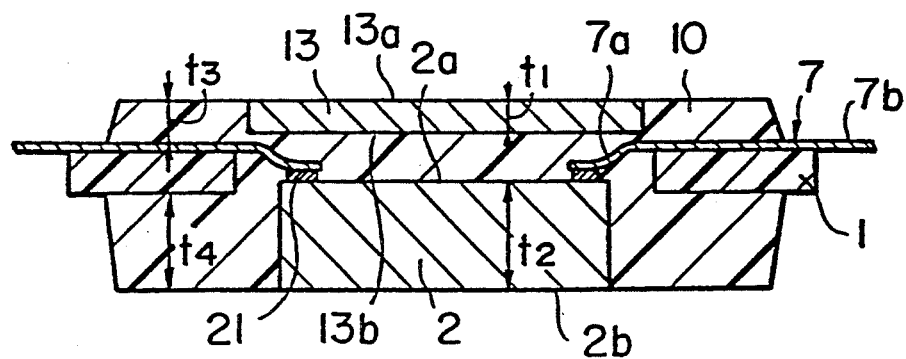

FIG. IIA
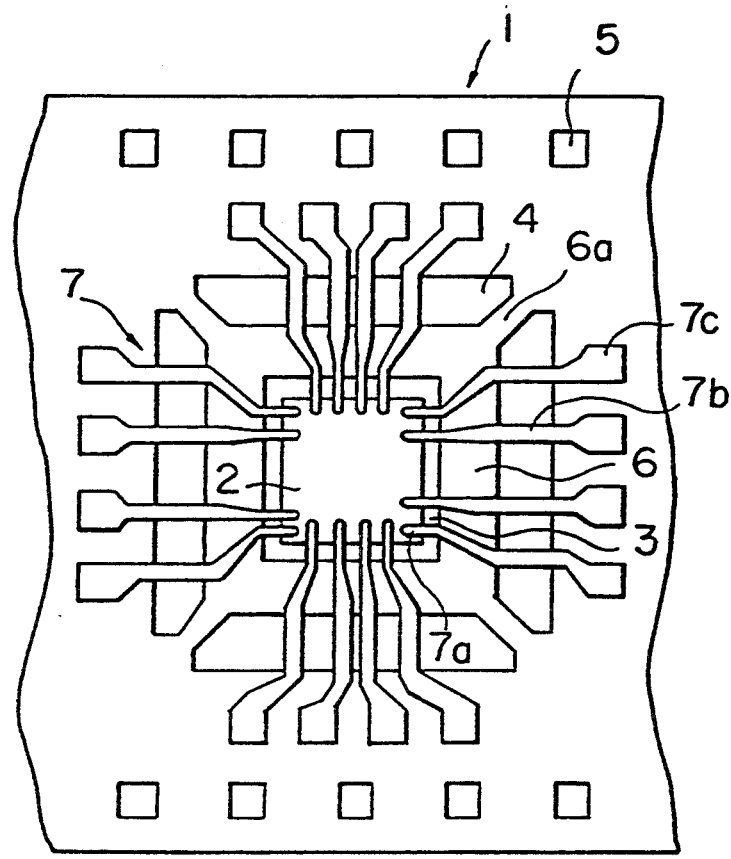
FIG. IIB
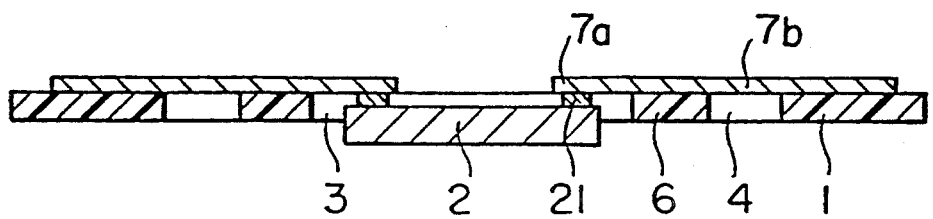

TAPE AUTOMATED BONDING PACKAGED SEMICONDUCTOR DEVICE INCORPORATING A HEAT SINK

This application is a continuation of application Ser. No. 07/401,145, filed Aug. 31, 1989, now abandoned.

BACKGROUND OF THE INVENTION

1. Field of the Invention

The present invention relates to a semiconductor device and, more particularly, to a semiconductor device arranged such that the semiconductor chip is mounted on a tape carrier by a TAB (Tape Automated Bonding) method and the heat radiating performance is improved.

2. Description of the Related Art

FIGS. 11A and 11B illustrate a tape carrier on which a semiconductor chip is mounted. The tape carrier includes a tape base material 1 formed in a film-like shape. The tape base material 1 is made of an insulating material, such as an epoxy resin in which a glass fiber is embedded, polyethylene, or polyimide. This tape base material 1 is provided with a plurality of perforations 5 along the two side edges thereof at equal intervals, and is further provided with a rectangular center device hole 3 in a central portion thereof for the purpose of accommodating a semiconductor chip 2. The portions surrounding the center device hole 3 are provided with a plurality of outer lead holes 4. A plurality of leads 7 made of copper are secured to the upper surface of this base material 1. These leads 7 are supported by a support portion 6 disposed between the center device hole 3 and the outer lead holes 4. The front portions of these leads 7 project as inner leads 7a into the center device hole 3, while the intermediate portions which serve as outer leads 7b to be connected to the electrodes of an outer circuit, are positioned above the outer lead holes 4. The rear portions of the leads 7 are provided with test pads 7c. The support portion 6 is connected to the tape base material 1 with bridge portions 6a disposed between the neighboring outer lead holes 4. As shown in FIG. 11B, in the center device hole 3, bump electrodes 21 of the semiconductor chip 2 are connected to the inner leads 7a of the leads 7.

The semiconductor chip 2 mounted on the tape carrier as described above is molded in a package, for example, of a type shown in FIGS. 12A and 12B. The semiconductor chip 2 is accommodated in an electrically conductive cap 8 such that the lower surface thereof and the electrically conductive cap 8 are joined by soldering or an electrically conductive adhesive 9. The electrically conductive cap 8 is provided with a flange 8a in the peripheral portion thereof, the support portion 6 of the tape carrier being supported on this flange 8a. Resin such as an epoxy resin or the like is supplied to the inside of the electrically conductive cap 8 and on the upper surface of the tape carrier so that a main package body 10 of the semiconductor chip 2 is formed. The leads 7 are then cut at the positions between the outer leads 7b and the test pads 7c, and the bridge portions 6a of the tape base material 1 are cut. As a result, a semiconductor device is formed.

The above-described electrically conductive cap 8 serves as a lead when a certain potential needs to be applied to the reverse side of the semiconductor chip 2 and serves as a heat radiating means for radiating heat generated in the operating semiconductor chip 2.

Recently, the radiation from the semiconductor chip 2 has been increased in accordance with a tendency toward higher density and higher speed semiconductor devices. Therefore, in order to improve the heat radiating performance of a semiconductor device, a semiconductor device of the type employed is arranged such that heat radiating fins 11 are secured, as shown in FIGS. 13A and 13B, to the reverse side of the electrically conductive cap 8 by solder 12 or an electrically conductive adhesive.

However, the semiconductor device shown in FIGS. 13A and 13B suffers from deterioration in heat radiating performance due to a resistance to heat conduction caused from contact of four types of layers consisting of an electrically conductive adhesive 9, the electrically conductive cap 8, the solder 12, and the heat radiating fins 11 which are present between the lower surface of the semiconductor chip 2 and the outside thereof.

Furthermore, the thickness of the resin on the upper surface of the semiconductor chip 2 for the purpose of forming the main package body 10 cannot be made sufficiently thin since the package needs to maintain its predetermined strength and reliability. This leads to the fact that the heat radiation from the upper surface of the semiconductor chip 2 is insufficient.

As described above, the conventional semiconductor devices manufactured by the TAB method suffer from poor heat radiating performance.

SUMMARY OF THE INVENTION

An object of the present invention is to provide a semiconductor device capable of overcoming the above-described problems and which displays an excellent heat radiating performance although manufactured by a TAB method.

A semiconductor device according to the present invention comprises an insulating film having an opening portion; a semiconductor chip accommodated in the opening portion of the insulating film and provided with a plurality of electrodes on the upper surface thereof; a plurality of leads, one of whose ends is connected to the corresponding electrodes of the semiconductor chip, the plurality of leads being supported on the upper surface of the insulating film; heat radiating means disposed such that the lower surface thereof confronts the upper surface of the semiconductor chip; and a main package body for packaging the semiconductor chip such that the upper surface of the heat radiating means and other ends of the plurality of leads appear outside the package.

BRIEF DESCRIPTION OF THE DRAWINGS

FIGS. 1A and 1B are a perspective view and a cross-sectional view, respectively, which illustrate a first embodiment of a semiconductor device according to the present invention;

FIGS. 11A and 11B are a plan view and a cross-sectional view, each of which illustrate a tape carrier on which a device is mounted;

DESCRIPTION OF THE PREFERRED EMBODIMENTS

Figure 1C:
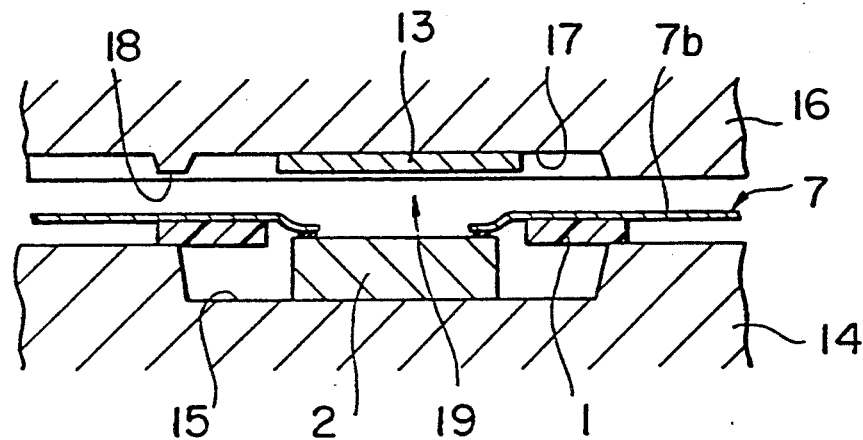
FIGS. 1C and 1D are cross-sectional views which illustrate a process for resin packaging the device according to the first embodiment of the present invention.

Embodiments of the present invention will now be described with reference to the accompanying drawings.

Referring to FIGS. 1A and 1B, a semiconductor device according to a first embodiment of the present invention includes a tape base material 1 made of an insulating film. The central portion of the tape base material 1 is provided with a center device hole 3 in the form of a rectangular opening. A semiconductor chip 2 is positioned within this center device hole 3. A plurality of leads 7 made of copper are secured to the upper surface of the tape base material 1. The front ends of these leads 7 project into the center device hole 3 as inner leads 7a, while the rear ends of the same project over the tape base material 1 as outer leads 7b. A plurality of bump electrodes 21 are formed on the upper surface 2a of the semiconductor chip 2, each of these bump electrodes 21 being connected to a corresponding inner lead 7a of the leads 7.

The above-described semiconductor chip 2, the tape base material 1, and the leads 7 are packed in a main package body 10 made of a resin such as an epoxy resin. However, the lower surface 2b of the semiconductor chip 2 and the outer leads 7b of the leads 7 extend outwardly. A rectangular heat radiating plate 13 having a size slightly larger than that of the upper surface 2a of the semiconductor chip 2 is embedded in the main package body 10 above the semiconductor chip 2. This heat radiating plate 13 is made of metal that exhibits an excellent heat conductivity such as copper and has a lower surface 13b thereof positioned adjacent to the upper surface 2a of the semiconductor chip 2 such that it does not come in contact with the leads 7. The upper surface 13a of the heat radiating plate 13 faces outwardly.

The thus-structured semiconductor device can be manufactured as follows. First, semiconductor chip 2 is mounted on a tape carrier shown in FIGS. 11A and 11B, and the tape carrier is, as shown in FIG. 1C, positioned on the lower mold 14 together with the semiconductor chip 2. At this time, the semiconductor chip 2 needs to be positioned within the cavity half 15 of the lower mold 14. On the other hand, the heat radiating plate 13 is held within a cavity half 17 of an upper mold 16. This heat radiating plate 13 can be, for example, supported by means of a vacuum produced through a suction port (not shown) formed in the upper mold 16 and facing the cavity half 17.

After the upper mold 16 and the lower mold 14 have been clamped, molten resin is injected, through a gate 18 formed in the upper mold 16, into a cavity 19 formed by a pair of cavity halves 15 and 17. After the resin has been set, the molded product is taken out by opening the upper mold 16 and the lower mold 14, the leads 7 are cut at the positions between the outer leads 7b and test pads (not shown), and bridge portions (not shown) of the tape base material 1 are cut so that the semiconductor device is manufactured.

Figure 1D:
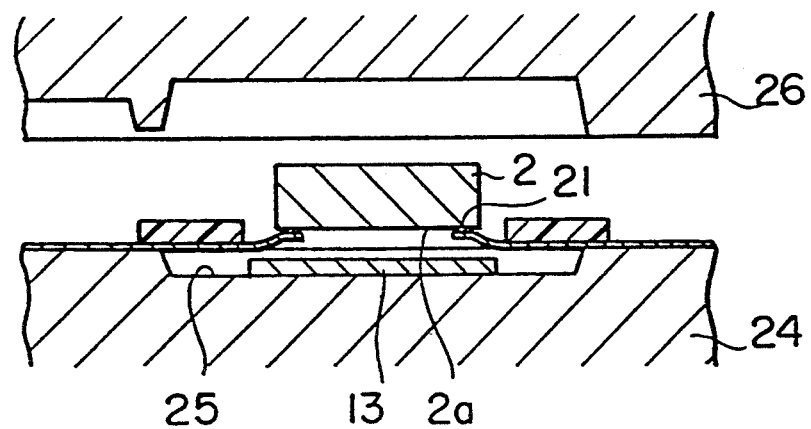

As an alternative and as shown in FIG. 1D, a structure may be employed which is arranged such that the heat radiating plate 13 is positioned within a cavity half 25 of a lower mold 24, the tape carrier is positioned on this lower mold 24 such that the side 2a of the semiconductor chip 2 on which the bump electrodes 21 are formed faces downward, and an upper mold 26 and the lower mold 24 are clamped before injecting resin. Thus, no means for supporting the heat radiating plate 13 is necessary.

In the semiconductor device manufactured as described above, a part of the heat generated in the semiconductor chip 2 during the operation thereof is conducted to the heat radiating plate 13 from the upper surface 2a of the semiconductor chip 2, and then this heat is radiated through the upper surface 13a of the heat radiating plate 13. Another portion of the heat is directly radiated outside through the lower surface 2b of the semiconductor chip 2. As a result, the heat radiating performance can be significantly improved.

Figure 2A:
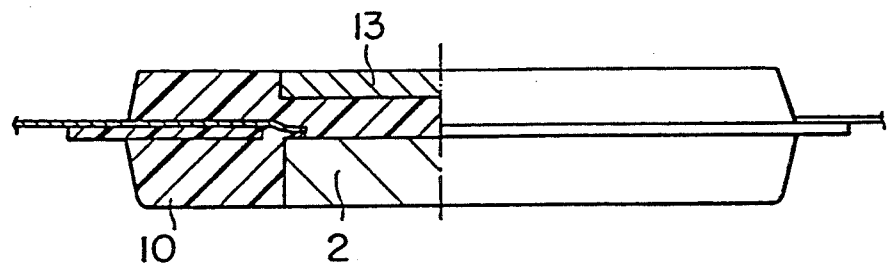
FIGS. 2A to 2C are partially sectioned front views, each of which illustrates warp generated in the first embodiment.
Figure 2B:
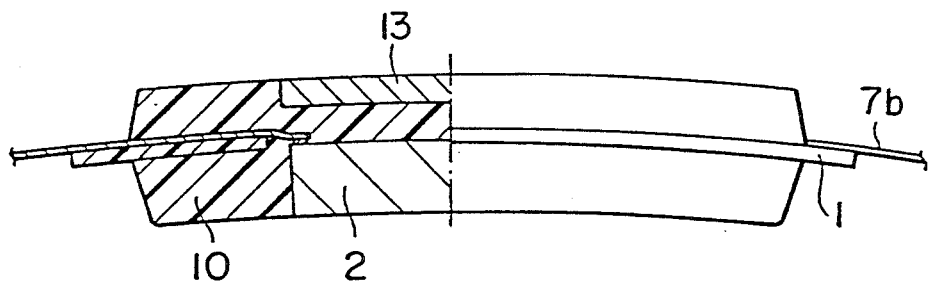
Figure 2C:
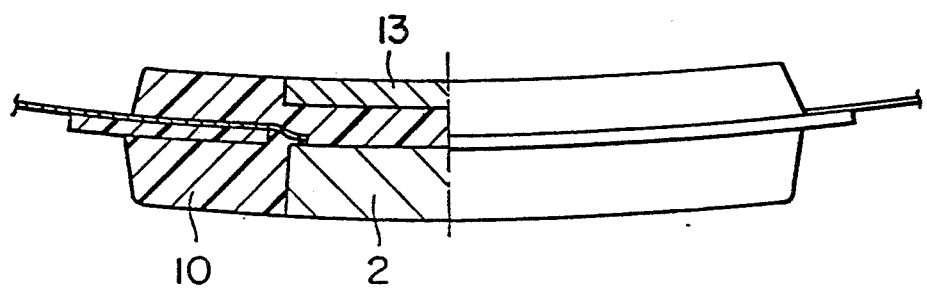

According to this first embodiment, the heat radiating plate 13 is made of, for example, copper which displays a thermal expansion coefficient which is significantly different from that of silicon, the major material for forming the semiconductor chip 2. In addition, since the main package body 10 is formed by means of injecting molten resin, the heat radiating plate 13 and the semiconductor chip 2 are subjected to high temperatures at this time, whereby the two components are also subjected to a considerable temperature drop when they reach room temperature. Therefore, in order to manufacture a semiconductor device without causing any warp, as shown in FIG. 2A, it is preferable to have the thickness t1 of the heat radiating plate 13 and the thickness t2 of the semiconductor chip 2 shown in FIG. 1B determined to make the amount of contraction of the heat radiating plate 13 and that of the semiconductor chip 2 equal to each other during the temperature drop after the resin molding step. If the amount of contraction of the heat radiating plate 13 and that of the semiconductor chip 2 are not the same, warp of the semiconductor device can adversely occur as shown in FIGS. 2B and 2C as the device cools to room temperature. In addition, if the thickness t3 and t4 of the resin layers respectively disposed above and below the tape base material 1 shown in FIG. 1B are not the same, warp can similarly occur.

Figure 3A:
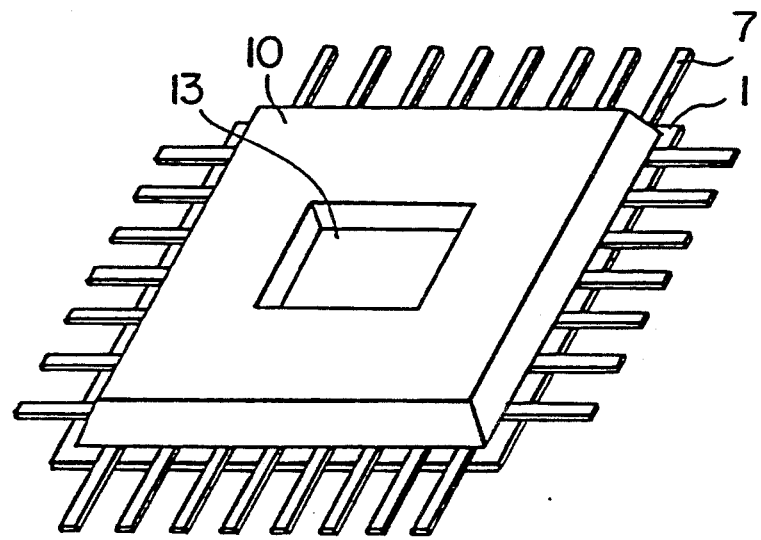
FIGS. 3A and 3B are a perspective view and a cross-sectional view, each of which illustrates a second embodiment of the present invention.
Figure 3B:
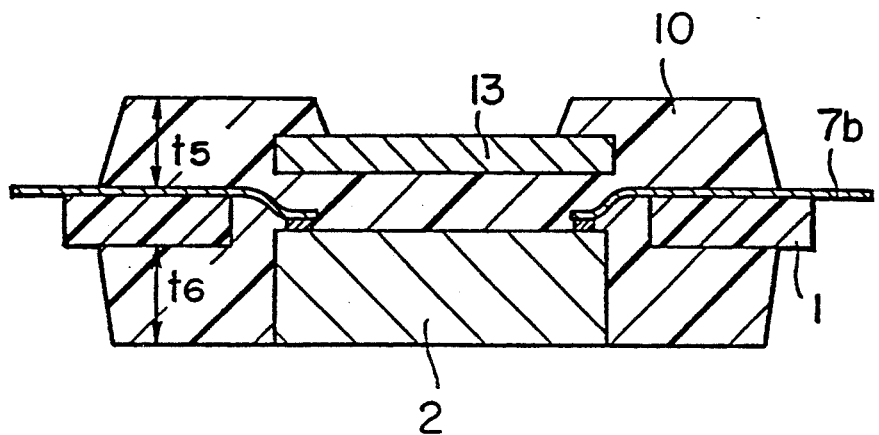

A second embodiment of the present invention is shown in FIGS. 3A and 3B.

According to this embodiment, the resin forming the main package body 10 reaches the upper edges of the upper surface 13a of the heat radiating plate 13. As a result, the thickness t5 and t6 of the resin layers respectively disposed above and below the tape base material 1 can be made equal. Therefore, a semiconductor device capable of overcoming warp above and below the tape base material 1 can be obtained. In this case, since the thickness of the resin layer surrounding the heat radiating plate 13 is simply increased but the thickness of the resin layer between the heat radiating plate 13 and the semiconductor chip 2 is not increased, the obtainable heat radiating performance is similar to that obtained by the first embodiment.

Figure 4A:
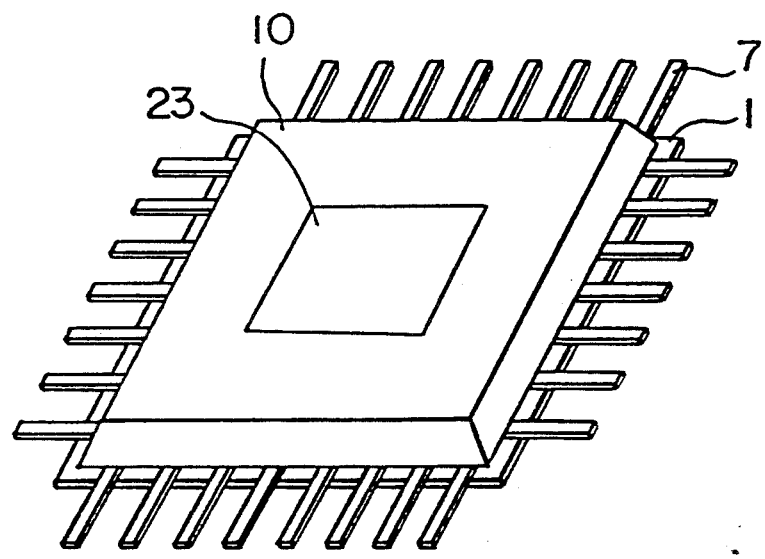
FIGS. 4A and 4B are perspective view and a cross-sectional view, each of which illustrates a third embodiment.
Figure 4B:
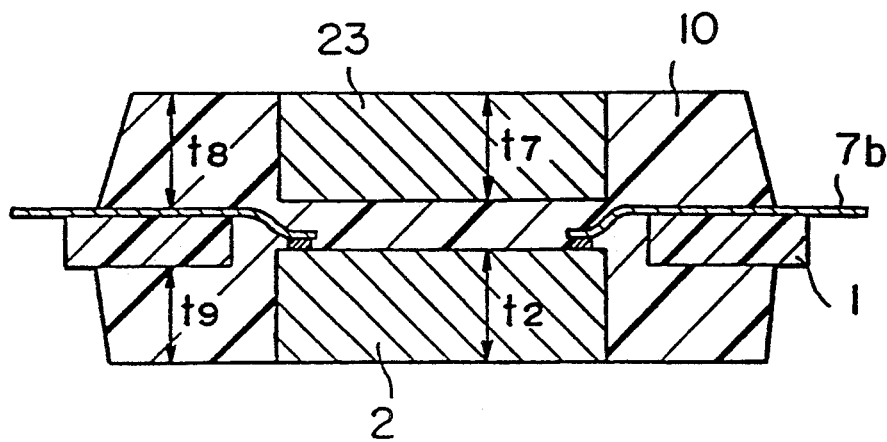

A third embodiment of the present invention is shown in FIGS. 4A and 4B. According to this embodiment, a heat radiating plate 23 is made of aluminum nitride AlN displaying a linear expansion coefficient of $3.4 \times 10^{-6}[K^{-1}]$. This linear expansion coefficient of aluminum nitride approximates the linear expansion coefficient $3.5 \times 10^{-6}[K^{-1}]$ of silicon, the major material for forming the semiconductor chip 2. Therefore, the heat radiating plate 23 and the semiconductor chip 2 can display the same thermal deformation by making the thickness t7 of the heat radiating plate 23 substantially the same as the thickness t2 of the semiconductor chip 2. In this case, the thickness t8 of the resin layer above the tape base material 1 and that t9 of the same below the tape base material 1 are substantially the same. Therefore, a semiconductor device which does not warp can be obtained. The material of the heat radiating plate 23 is not limited to the above-described aluminum nitride. Any material displaying a linear expansion coefficient which approximates that of the silicon forming the semiconductor chip 2 can be employed. In particular, if the heat radiating plate 23 were made of silicon similarly to the semiconductor chip 2, the difference between the two linear expansion coefficients can be cancelled, causing a further excellent effect.

Figure 5A:
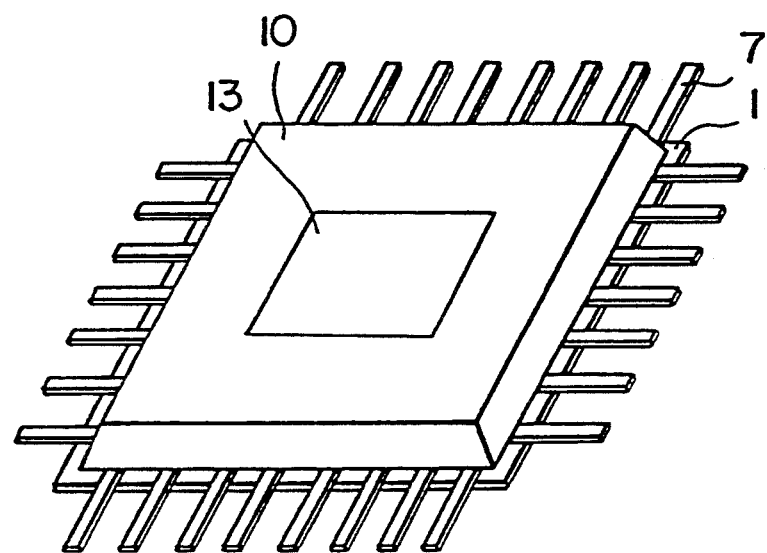
FIGS. 5A and 5B are a perspective view and a cross-sectional view, each of which illustrates a fourth embodiment.
Figure 5B:
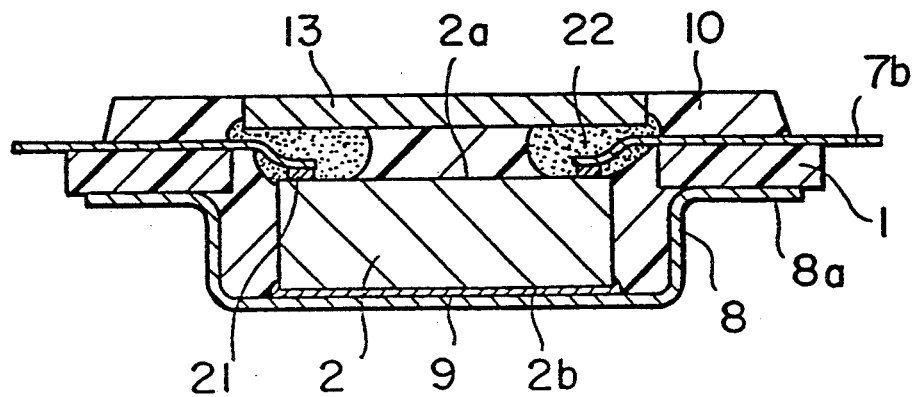

A fourth embodiment of the present invention is shown in FIGS. 5A and 5B. According to this embodiment, the heat radiating plate 13 and the semiconductor chip 2 are adhered to each other with a flexible silicone resin 22. When resin packaging of the semiconductor chip 2 uses a mold with the heat radiating plate 13 adhered to the semiconductor chip 2 as described above, an inevitable shift of the positional relationship between the heat radiating plate 13 and the semiconductor chip 2 or an electric short circuit between the heat radiating plate 13 and the leads 7 at the time of injecting resin in the mold can be prevented. Since the silicone resin 22 is flexible, slight dimensional errors of the heat radiating plate 13, the semiconductor chip 2, and the like at the time of clamping the mold can be absorbed by this silicone resin 22, whereby a product exhibiting high quality can be obtained.

When a silicone resin 22 in which a filler exhibiting excellent heat conductivity, such as silicon carbide is dispersed is used, heat generated in the semiconductor chip 2 can be conducted to the heat radiating plate 13 via this silicone resin 22 and the heat radiating performance can be additionally improved. When a flexible adhesive displaying excellent heat conductivity is used as an alternative to the silicone resin 22, the heat radiating performance can be improved even if the filler is not dispersed in the adhesive. Although the silicone resin 22 is supplied to in the vicinity of the bump electrodes 21 of the semiconductor chip 2 secured to the heat radiating plate 13, referring to FIG. 5B, the silicone resin 22 may be supplied to the central portion of the upper surface 2a of the semiconductor chip 2.

According to this fourth embodiment, an electrically conductive cap 8 is secured to the lower surface 2b of the semiconductor chip 2 by means of solder or the electrically conductive adhesive 9. This electrically conductive cap 8 is provided with a flange 8a in the peripheral portion thereof, this flange 8a being secured to the lower surface of the tape base material 1. This electrically conductive cap 8 is formed by, for example, drawing a 0.1 mm thick iron nickel alloy sheet and then plating it with silver. This electrically conductive cap 8 is introduced into the mold while being secured to the lower surface 2b of the semiconductor chip 2 and of the tape base material 1 before the resin injection. Therefore, a shift of the semiconductor chip 2 due to the injecting pressure of the resin can be prevented, whereby a semiconductor device exhibiting a significant reliability can be obtained. In the case where a certain electric potential needs to be maintained on the lower surface 2b of the semiconductor chip 2, the electrically conductive cap 8 serves as a lead. In addition, since the electrically conductive cap 8 covers the lower surface 2b of the semiconductor chip 2, water invasion through the boundary between the semiconductor chip 2 and the main package body 10 can be prevented, whereby reliability can be improved. Heat generated in the semiconductor chip 2 during the operation can be radiated from the lower surface 2b of the semiconductor chip 2 through the electrically conductive cap 8.

Figure 6A:
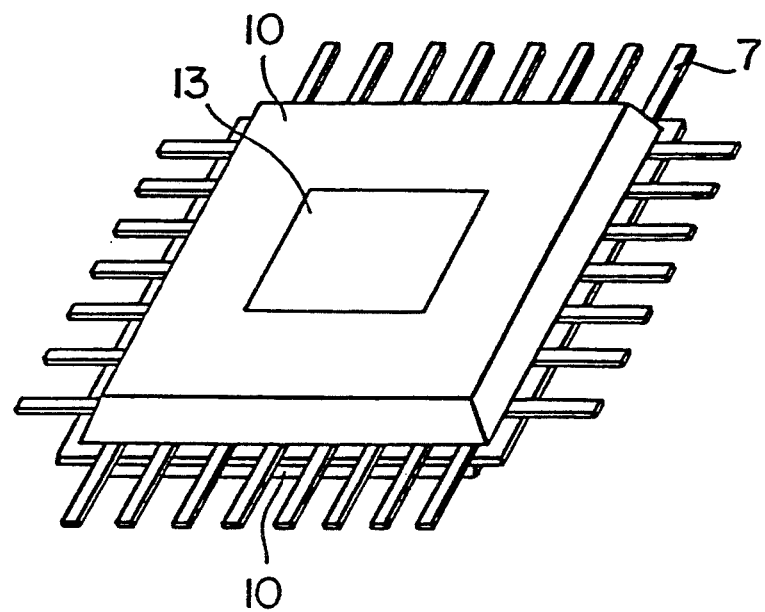
FIGS. 6A and 6B are a perspective view and a cross-sectional view, each of which illustrates a fifth embodiment.
Figure 6B:
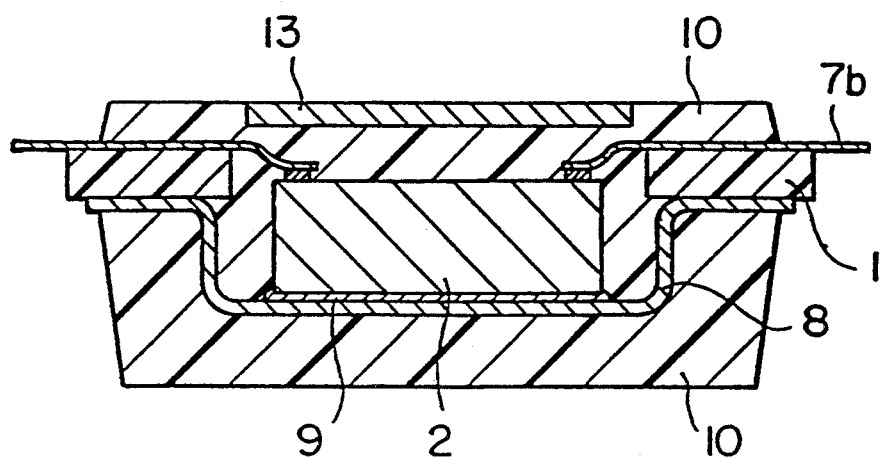

A fifth embodiment of the present invention is shown in FIGS. 6A and 6B. In this embodiment, the heat radiating plate 13 is arranged such that resin forming the main package body 10 is also applied to the lower side of the electrically conductive cap 8. In this case, since the heat radiating plate 13 is provided, the heat radiating performance of the semiconductor chip 2 from the upper surface 2a thereof can be improved.

Figure 7A:
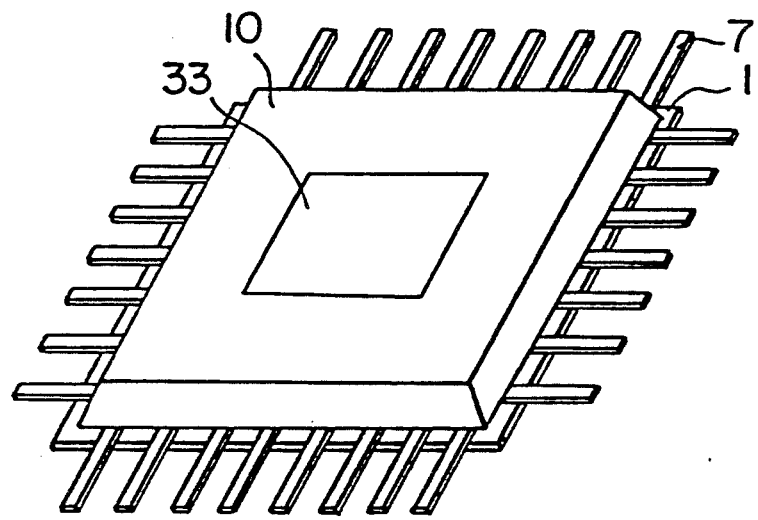
FIGS. 7A and 7B are a perspective view and a cross-sectional view, each of which illustrates a sixth embodiment.
Figure 7B:
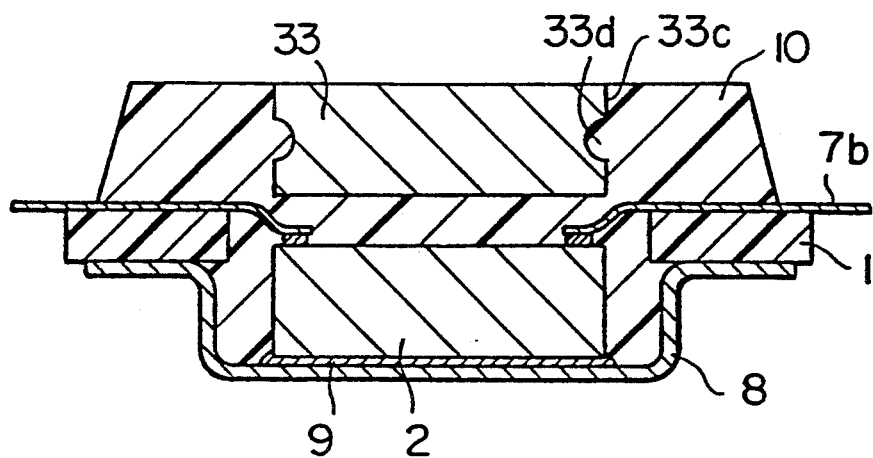

A sixth embodiment of the present invention is shown in FIGS. 7A and 7B. According to this embodiment, a groove 33d is formed along a side surface 33c of a heat radiating plate 33. As a result of provision of this groove 33d of the type described above, adhesion between the heat radiating plate 33 and the main package body 10 can be improved. Therefore, a semiconductor device exhibiting improved reliability can be obtained.

Figure 8A:
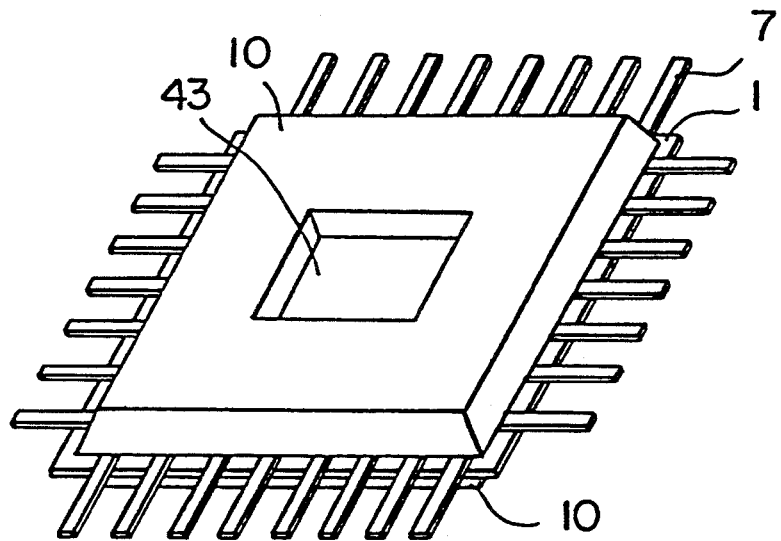
FIGS. 8A and 8B are a perspective view and a cross-sectional view, each of which illustrates a seventh embodiment.
Figure 8B:
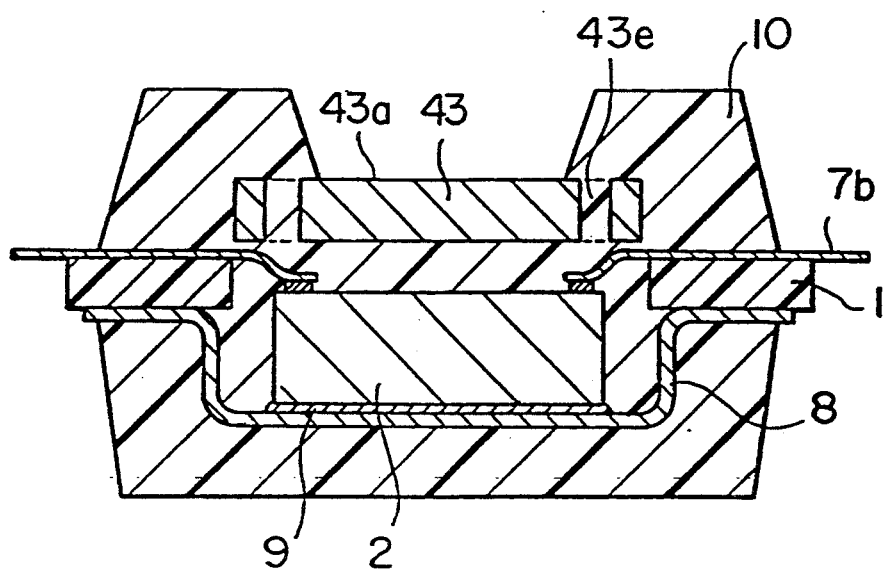

As shown in FIGS. 8A and 8B in which a seventh embodiment is shown, through holes 43e which vertically penetrate a heat radiating plate 43 may be formed in the peripheral portion of this heat radiating plate 43 as an alternative to the above-described groove 33d. In this case, the resin which forms the main package body 10 is supplied, similar to the above-described second embodiment, to the portion exceeding the edges of the upper surface 43a of the heat radiating plate 43 to form the through holes 43e in the heat radiating plate 43 filled with the resin. As a result, the heat radiating plate 43 and the main package body 10 can be strongly adhered to each other.

Figure 9A:
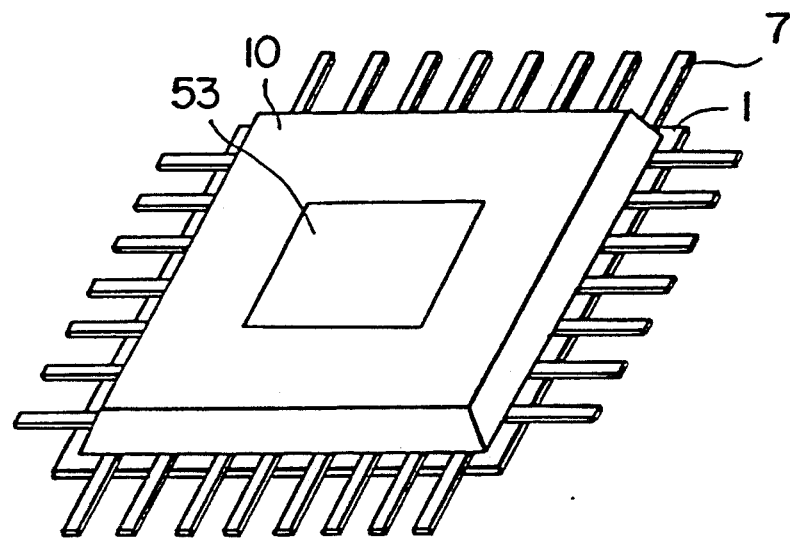
FIGS. 9A and 9B are a perspective view and a cross-sectional view, each of which illustrates an eighth embodiment.
Figure 9B:
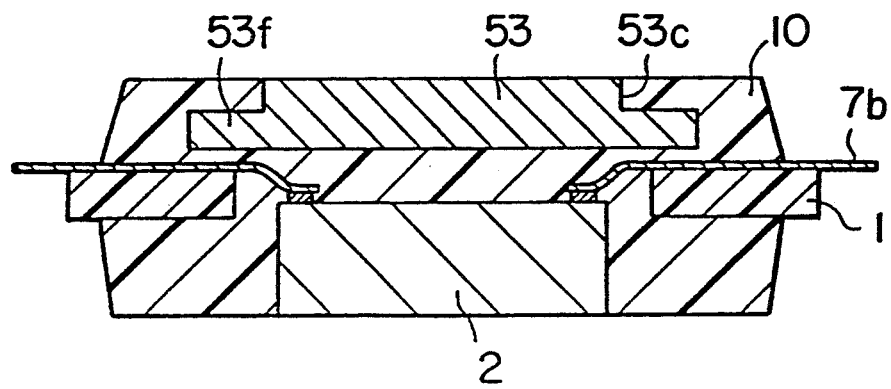
Figure 10A:
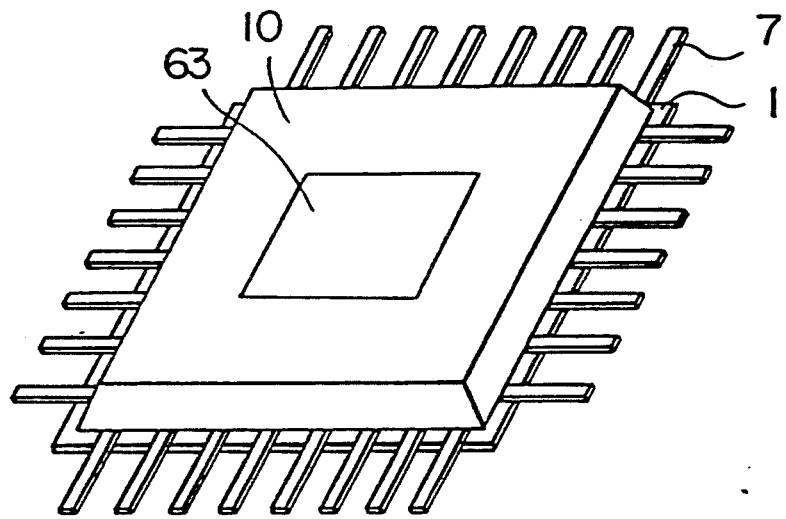
FIGS. 10A and 10B are a perspective view and a cross-sectional view, each of which illustrates a ninth embodiment.
Figure 10B:
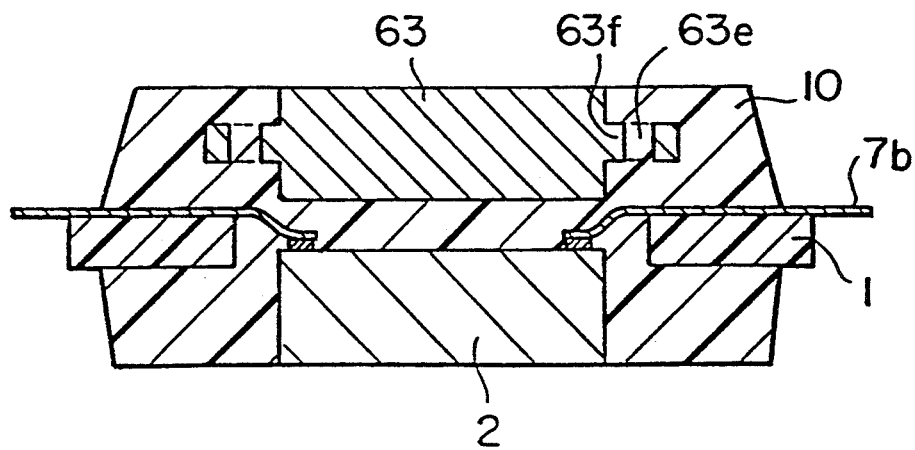
Figure 12A:
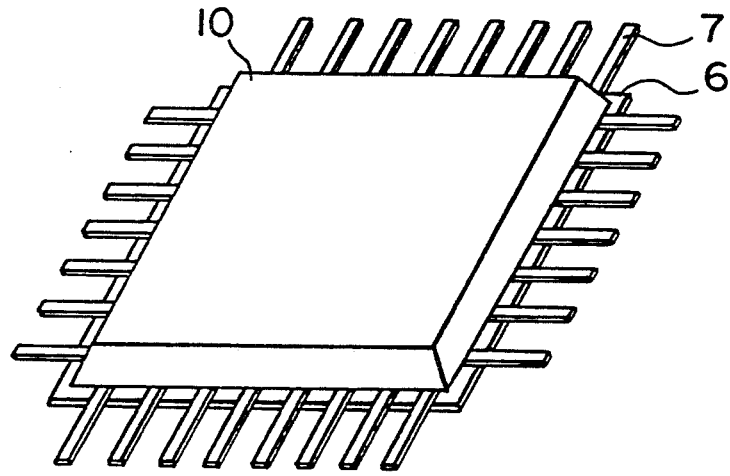
FIGS. 12A and 12B are a perspective view and a partially sectioned front view, each of which illustrates a conventional semiconductor device.
Figure 12B:
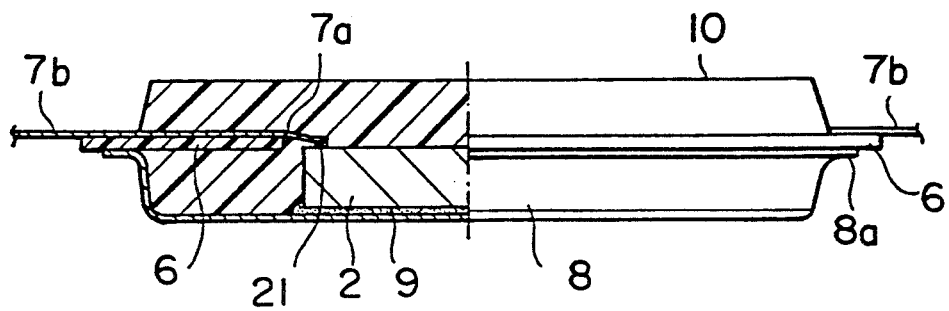
Figure 13A:
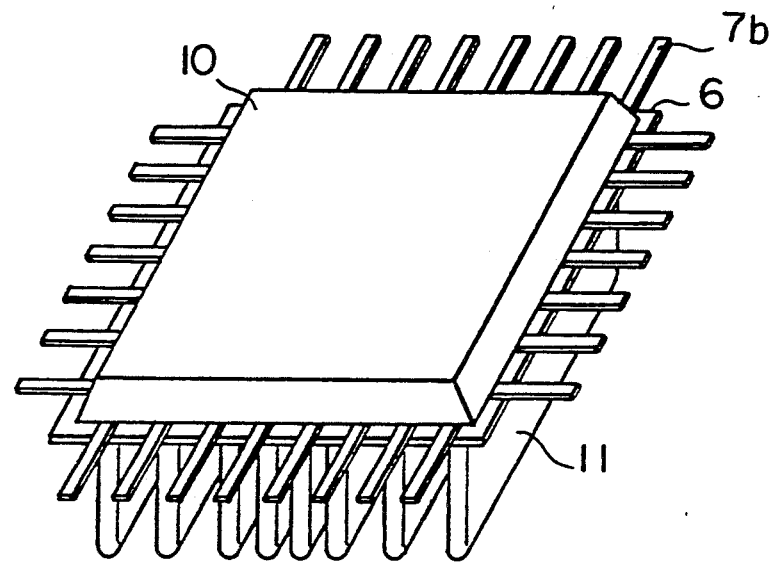
FIGS. 13A and 13B are perspective view and a cross-sectional view, each of which illustrates another conventional semiconductor device.
Figure 13B:
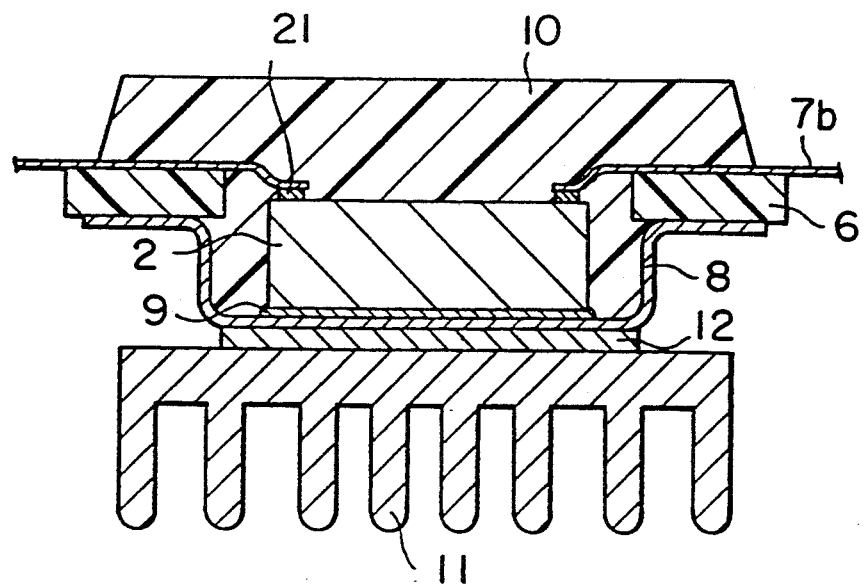

It might be considered feasible to employ a variety of methods to improve the adhering performance between the heat radiating plate and the main package body 10, being exemplified by a flange 53f formed along a side surface 53c of a heat radiating plate 53 according to an eighth embodiment shown in FIGS. 9A and 9B; and, according to a ninth embodiment shown in FIGS. 10A and 10B, a flange 63f formed along a side surface 63c of a heat radiating plate 63 and suitable through holes 63e formed in this flange 63f. Although omitted from illustration, a similar effect can be obtained by forming uneven portions on the surface of the heat radiating plate and forming dimples on the same.

What is claimed is:

1. A packaged semiconductor device comprising:
   an insulating film having opposed first and second surfaces and an opening;
   a semiconductor chip having opposed first and second surfaces disposed in said opening of said insulating film and including a plurality of electrodes on the first surface of said chip;
   a plurality of leads, each having first and second ends, the first ends being connected to corresponding electrodes of said semiconductor chip, said plurality of leads being supported on the first surface of said insulating film;
   plate-shaped heat radiating means disposed opposite and spaced from the first surface of said semiconductor chip; and
   a resin package body encapsulating said semiconductor chip, disposed between and contacting the first surface of said semiconductor chip and said heat radiating means, separating and isolating said semiconductor chip from said heat radiating means, leaving the second ends of said plurality of leads extending outwardly from said package body, and partially encapsulating said heat radiating means with part of said heat radiating means externally exposed wherein said heat radiating means has a higher heat conductivity than said resin package body.

2. A packaged semiconductor device according to claim 1 wherein said heat radiating means is smaller than said package body.

3. A packaged semiconductor device according to claim 2 wherein said package body has a thickness and the thickness of a portion of said package body positioned on a first side of said insulating film is substantially the same as the thickness of a portion of the package body on a second side of said insulating film.

4. A packaged semiconductor device according to claim 3 wherein said heat radiating means is disposed on the first side of said insulating film and said package body extends in thickness beyond said heat radiating means on the first side of said insulating film.

5. A packaged semiconductor device according to claim 1 further comprising a semiconductor chip support member secured to the second surface of said semiconductor chip and having a peripheral portion secured to the second surface of said insulating film.

6. A packaged semiconductor device according to claim 5 wherein said semiconductor chip support member is electrically conductive.

7. A packaged semiconductor device comprising:
   an insulating film having opposed first and second surfaces and an opening;
   a semiconductor chip having opposed first and second surfaces disposed in said opening of said insulating film and including a plurality of electrodes on the first surface of said chip;
   a plurality of leads, each having first and second ends, the first ends being connected to corresponding electrodes of said semiconductor chip, said plurality of leads being supported on the first surface of said insulating film;
   metal heat radiating means disposed opposite and spaced from the first surface of said semiconductor chip; and
   a resin package body encapsulating said semiconductor chip, disposed between and contacting the first surface of said semiconductor chip and said heat radiating means, separating and isolating said semiconductor chip from said heat radiating means, leaving the second ends of said plurality of leads extending outwardly from said package body and partially encapsulating said heat radiating means with part of said heat radiating means externally exposed.

8. A packaged semiconductor device according to claim 7, wherein said metal heat radiating means is copper.

9. A packaged semiconductor device comprising:
   an insulating film having opposed first and second surfaces and an opening;
   a semiconductor chip having opposed first and second surfaces disposed in said opening of said insulating film and including a plurality of electrodes on the first surface of said chip;
   a plurality of leads, each having first and second ends, the first ends being connected to corresponding electrodes of said semiconductor chip, said plurality of leads being supported on the first surface of said insulating film;
   plate-shaped heat radiating means having substantially the same coefficient of thermal expansion as said semiconductor chip disposed opposite and spaced from the first surface of said semiconductor chip; and
   a resin package body encapsulating said semiconductor chip, disposed between and contacting the first surface of said semiconductor chip and said heating radiating means, separating and isolating said semiconductor chip from said heat radiating means, leaving the second ends of said plurality of leads extending outwardly from said package body, and partially encapsulating said heat radiating means with part of said heat radiating means externally exposed wherein said heat radiating means is smaller than said resin package body and has a higher heat conductivity than said resin package body.

10. A packaged semiconductor device according to claim 9 wherein said semiconductor chip is silicon and said heat radiating means is aluminum nitride.

11. A packaged semiconductor device according to claim 9 wherein said heat radiating means and semiconductor chip have substantially the same thicknesses.

12. A packaged semiconductor device comprising:
    an insulating film having opposed first and second surfaces and an opening;
    a semiconductor chip having opposed first and second surfaces disposed in said opening of said insulating film and including a plurality of electrodes on the first surface of said chip;
    a plurality of leads, each having first and second ends, the first ends being connected to corresponding electrodes of said semiconductor chip, said plurality of leads being supported on the first surface of said insulating film;

plate-shaped heat radiating means disposed opposite and spaced from the first surface of said semiconductor chip;

an electrically insulating adhesive directly contacting and adhering said heat radiating means to said semiconductor chip; and a resin package body encapsulating said semiconductor chip, disposed between the first surface of said semiconductor chip and said heat radiating means, leaving the second ends of said plurality of leads extending outwardly from said package body and partially encapsulating said heat radiating means with part of said heat radiating means externally exposed wherein said heat radiating means has a higher heat conductivity than said resin package body.

13. A packaged semiconductor device according to claim 12 wherein said adhesive is flexible.

14. A packaged semiconductor device according to claim 13 wherein said adhesive is a resin.

15. A packaged semiconductor device according to claim 14 wherein said adhesive is a silicone resin.

16. A packaged semiconductor device comprising:

an insulating film having opposed first and second surfaces and an opening;

a semiconductor chip having opposed first and second surfaces disposed in said opening of said insulating film and including a plurality of electrodes on the first surface of said chip;

a plurality of leads, each having first and second ends, the first ends being connected to corresponding electrodes of said semiconductor chip, said plurality of leads being supported on the first surface of said insulating film;

plate-shaped heat radiating means disposed opposite and spaced from the first surface of said semiconductor chip;

an electrically insulating resin adhesive containing a high thermal conductivity filler adhering said heat radiating means to said semiconductor chip; and a resin package body encapsulating said semiconductor chip, disposed between the first surface of said semiconductor chip and said heat radiating means, leaving the second ends of said plurality of leads extending outwardly from said package body and partially encapsulating said heat radiating means with part of said heat radiating means externally exposed wherein said heat radiating means has a higher heat conductivity than said resin package body.

17. A packaged semiconductor device according to claim 16 wherein said filler is silicon carbide.

18. A packaged semiconductor device comprising:

an insulating film having opposed first and second surfaces and an opening;

a semiconductor chip having opposed first and second surfaces disposed in said opening of said insulating film and including a plurality of electrodes on the first surface of said chip;

a plurality of leads, each having first and second ends, the first ends being connected to corresponding electrodes of said semiconductor chip, said plurality of leads being supported on the first surface of said insulating film;

plate-shaped heat radiating means disposed opposite and spaced from the first surface of said semiconductor chip; and a resin package body encapsulating said semiconductor chip, disposed between the first surface of said semiconductor chip and said heat radiating means, leaving the second ends of said plurality of leads extending outwardly from said package body and partially encapsulating said heat radiating means with part of said heat radiating means externally exposed including means for improving adhesion between said heat radiating means and said resin package body, wherein said heat radiating means has a higher heat conductivity than said resin package body and said heat radiating means is smaller than said resin package body.

19. A packaged semiconductor device according to claim 18, wherein said means for improving adhesion comprises a recess in said heat radiating means.

20. A packaged semiconductor device according to claim 18, wherein said means for improving adhesion comprises a projection on said heat radiating means.

21. A packaged semiconductor device according to claim 18, wherein said means for improving adhesion comprises a through hole in said heat radiating means.

22. A packaged semiconductor device according to claim 18, wherein said means for improving adhesion comprises a flange formed on said heat radiating means.

23. A packaged semiconductor device according to claim 22, wherein said flange includes through holes.

* * * * *

UNITED STATES PATENT AND TRADEMARK OFFICE
CERTIFICATE OF CORRECTION

PATENT NO. : 5,157,478

DATED : October 20, 1992

INVENTOR(S) : Ueda et al.

It is certified that error appears in the above-identified patent and that said Letters Patent is hereby corrected as shown below:

Claim 9, Column 8, Line 39, change "heating" to --heat--.

Signed and Sealed this

Fifth Day of October, 1993

Attest:

BRUCE LEHMAN

Attesting Officer

Commissioner of Patents and Trademarks